(12) United States Patent
Denis et al.

(10) Patent No.: US 7,082,294 B2
(45) Date of Patent: Jul. 25, 2006

(54) SELF-ADAPTIVE FREQUENCY BAND-PASS FILTERING DEVICE IN MICROWAVE SIGNAL TRANSCEIVER

(75) Inventors: Bernard Denis, St Senoux (FR); Philippe Gilberton, Lawrenceville, NJ (US)

(73) Assignee: Thomson Licensing, Boulogne (FR)

( * ) Notice: Subject to any disclaimer, the term of this patent is extended or adjusted under 35 U.S.C. 154(b) by 572 days.

(21) Appl. No.: 10/297,974

(22) PCT Filed: Jun. 12, 2001

(86) PCT No.: PCT/FR01/01816
§ 371 (c)(1),
(2), (4) Date: Dec. 12, 2002

(87) PCT Pub. No.: WO02/01718
PCT Pub. Date: Jan. 3, 2002

(65) Prior Publication Data
US 2003/0100272 A1 May 29, 2003

(51) Int. Cl.
H04B 1/06 (2006.01)
H04B 7/00 (2006.01)

(52) U.S. Cl. .................. 455/260; 455/76; 455/80; 455/313; 455/314; 455/323; 331/16; 331/11; 331/25

(58) Field of Classification Search ............. 455/76, 455/260, 320, 313, 314, 234.1, 234.2, 80; 375/376, 316, 345; 386/16
See application file for complete search history.

(56) References Cited

U.S. PATENT DOCUMENTS

| | | | | |
|---|---|---|---|---|
| 4,305,158 A | | 12/1981 | Fujishima et al. ........... 455/187 |
| 4,464,639 A | | 8/1984 | Staples ........................ 333/154 |
| 5,412,658 A | * | 5/1995 | Arnold et al. ............... 370/330 |
| 5,568,098 A | * | 10/1996 | Horie et al. ................... 331/16 |
| 5,649,311 A | * | 7/1997 | Somei ....................... 455/188.1 |
| 5,673,007 A | * | 9/1997 | Kirisawa ....................... 331/18 |
| 5,727,019 A | * | 3/1998 | Tatsumi ....................... 375/222 |
| 5,754,951 A | * | 5/1998 | Kashima et al. ............. 455/327 |
| 5,758,274 A | * | 5/1998 | Vu et al. .................. 455/246.1 |
| 5,794,133 A | * | 8/1998 | Kashima ....................... 455/333 |
| 5,937,338 A | * | 8/1999 | Tomita ....................... 455/161.2 |
| 6,002,925 A | * | 12/1999 | Vu et al. ....................... 455/313 |
| 6,064,866 A | | 5/2000 | Lange ....................... 455/180.1 |
| 6,240,122 B1 | * | 5/2001 | Miyashita ..................... 375/130 |

FOREIGN PATENT DOCUMENTS

| | | |
|---|---|---|
| EP | 0668656 | 8/1995 |
| EP | 0818888 | 1/1998 |
| FR | 2386191 | 10/1978 |

* cited by examiner

Primary Examiner—Marceau Milord
(74) Attorney, Agent, or Firm—Joseph J. Laks; Robert D. Shedd; Erian J. Cromarty

(57) ABSTRACT

The present invention relates to a self-adaptive band-pass filtering device in a microwave signal transmitter and/or receiver, the receiver being connected to a microwave signal receiving antenna connected to the input of a low-noise amplifier, a mixer that receives, on the one hand, the output signal of the low-noise amplifier and, on the other hand, the signal from a frequency synthesizer, characterized in that the self-adaptive filtering device comprises, upstream of the amplifier, on the one hand, at least one filtering means having at least two different frequency bands and, on the other hand, means for selecting either a filtering means or one of the frequency bands depending on the frequency of the signal to be received.

16 Claims, 4 Drawing Sheets

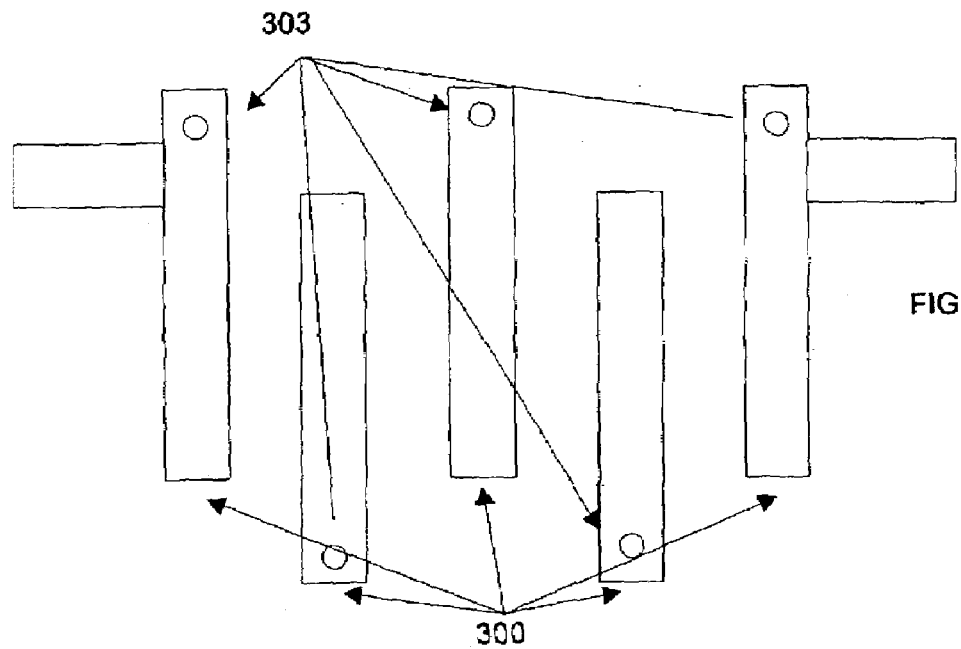
FIG. 4A
FIG. 4B
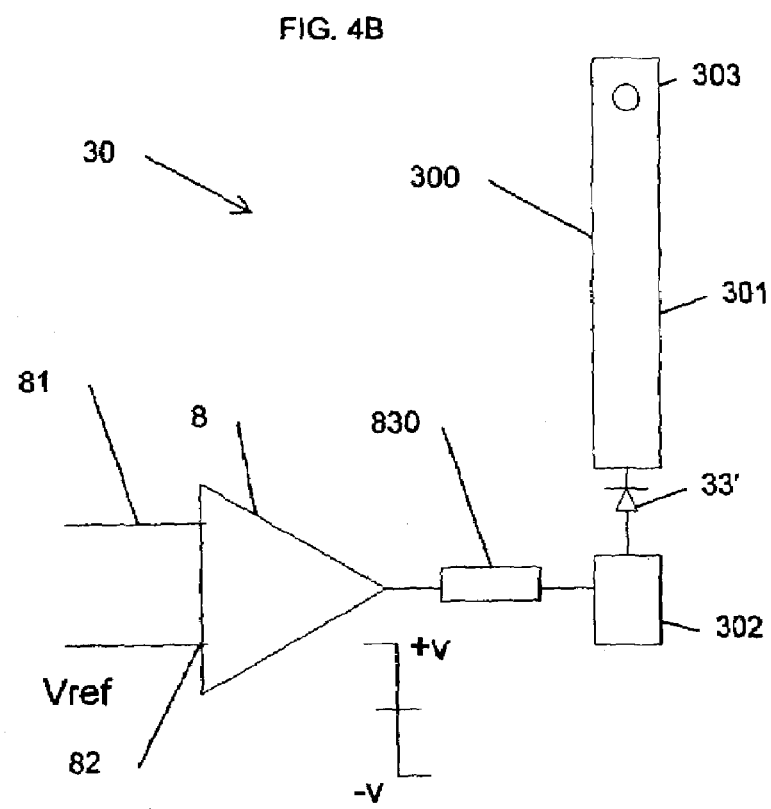

SELF-ADAPTIVE FREQUENCY BAND-PASS FILTERING DEVICE IN MICROWAVE SIGNAL TRANSCEIVER

This application claims the benefit, under 35 U.S.C. § 365 of International Application PCT/FR01/01816, filed Jun. 12, 2001, which was published in accordance with PCT Article 21(2) on Jan. 3, 2002 in French and which claims the benefit of French patent application No. 0008165 filed Jun. 26, 2000.

The present invention relates to a self-adaptive band-pass frequency-filtering device in a microwave signal transmitter/receiver, used especially to deploy a home digital wireless network. This type of network is based on the transmission and reception of information at microwave frequencies.

In the prior art, a device is known, from British Patent Application GB 2 335 100, that allows a narrow-frequency band-pass filter to be continuously tuned to the frequency of the incident signal, corresponding to a given reception channel. This filter, placed between a low-noise amplifier and a mixer, makes it possible to reject the image spectrum output by the amplifier and thus avoids the use of an image-spectrum rejection mixer which is more difficult to develop. The filter must therefore be characterized by a narrow frequency band corresponding to the necessary frequency band of the channel to be transmitted. The information about the frequency allowing the filter to be adjusted is picked up by means of a coupler upstream of the filter, so as to slave the filter to any drift in frequency of the incident signal and thereby not to depart from its narrow frequency band. However, slaving the filter to each channel can be accomplished only by knowing beforehand the frequency that the device receives. Consequently, the device described in that patent application is operational only in the case of an already established link.

The object of the present invention is therefore to remedy the drawbacks of the prior art by providing a filtering device that reduces the noise sensitivity of a low-noise amplifier of a microwave signal receiver and makes it easier to lock onto the frequency band to be analysed.

This objective is achieved by a self-adaptive band-pass filtering device in a microwave signal transmitter and/or receiver, the receiver being connected to a microwave signal receiving antenna connected to the input of a low-noise amplifier, a mixer that receives, on the one hand, the output signal of the low-noise amplifier and, on the other hand, the signal from a frequency synthesizer, characterized in that the self-adaptive filtering device comprises, upstream of the amplifier, on the one hand, at least one filtering means having at least two different frequency bands and, on the other hand, means for selecting either a filtering means or one of the frequency bands depending on the frequency of the signal to be received.

According to another feature, the filtering means comprise two filters and the selection means comprise a pair of microwave switches switching between two states, the said pair of switches being placed on each side of each band-pass filter, so that, in a first state of the pair of switches the signal received by the antenna is filtered by the first filter and in a second state of the pair of switches the signal received by the antenna is filtered by the second filter.

According to another feature, the two filters are intended for filtering a first frequency band and a second frequency band, respectively.

According to another feature, the filtering means comprise a filter based on microstrip lines, each microstrip line of which is divided into two separate portions by the switching means, each of the first and second portions of the microstrip lines being of a length defined so that when the switching means allow the received signal to pass, by coupling between microstrip lines, only into the first portion the filter is tuned to a first frequency band, and when the switching means allow the signal to pass, by coupling between microstrip lines, into the first and second portions the filter is tuned to the second frequency band.

According to another feature, the change of state of the switches of the selection means is triggered by a control means associated with the frequency synthesizer so that when the frequency imposed by the frequency synthesizer lies within a first frequency band B1 of the filtering means the control means delivers a signal for making the switches pass into the first state, and when the frequency imposed by the frequency synthesizer lies within a second frequency band B2 of the filtering means the control means delivers a signal for making the switches pass to the second state.

According to another feature, the control means comprises a comparator, a first input of which is connected via a buffer stage to the frequency synthesizer in order to receive the voltage-converted image of the frequency produced by the frequency synthesizer and a second input of which receives a defined reference voltage.

According to another feature, the control means comprises a comparator, a first input of which is connected to a processing circuit intended to deliver a voltage-converted image either of the frequency generated by the voltage-controlled oscillator or of the frequency of the microwave signal received by the antenna.

According to another feature, the processing circuit comprises a phase/frequency comparator, a first input of which receives a signal generated by a fixed-frequency oscillator, the second input of the phase/frequency comparator is connected to a switch controlled by the microprocessor, making it possible to connect the second input either, in a first position, to the output of the voltage-controlled oscillator or, in a second position, to a coupler delivering an image of the frequency of the signals received on the antenna, and the second input of the comparator receives a defined reference voltage.

According to another feature, each switch comprises a pair of high-speed diodes mounted in series so that a first pair of diodes is mounted between the antenna and the two filters and the second pair of diodes is mounted between the low-noise amplifier and the two filters.

According to another feature, the anode of the first diode, connected via its cathode to the first filter, and the cathode of the second diode, connected via its anode to the second filter, of the first and second pair of diodes respectively are connected, on the one hand, to the antenna and to the input of the low-noise amplifier respectively and, on the other hand, to the output of the comparator via the two links which then each include a shock inductor, the cathode of the first diode and the anode of the second diode of each pair of diodes being also connected to earth through the shock inductor.

According to another feature, the microwave switches of each microstrip line of the filter include a diode mounted in series between the two portions of the microstrip lines, the cathode of each diode is connected to a first end of the first portion of the microstrip lines, the second end of which is connected to earth, and the anode of each diode is connected to a first end of the second portion of the microstrip lines, the second end of which is connected to the output of the control means.

Thus, unlike the device described in Patent Application GB 2 335 100, the device according to the invention does not need to follow the drift in frequency of the transmission channel since the pass band of the two filters used is much broader than the pass band of the transmission channel. This is because, in the example taken as illustration, the pass band of a transmission channel is 20 MHz whereas the frequency band of B1 is 200 MHz and the frequency band of B2 is 255 MHz.

The invention, with its features and advantages, will become more clearly apparent on reading the description given with reference to the appended drawings in which:

FIGS. 4A and 4B show a second embodiment of the filters of the self-adaptive device according to the invention and the appropriate selection means.

Figure 1:
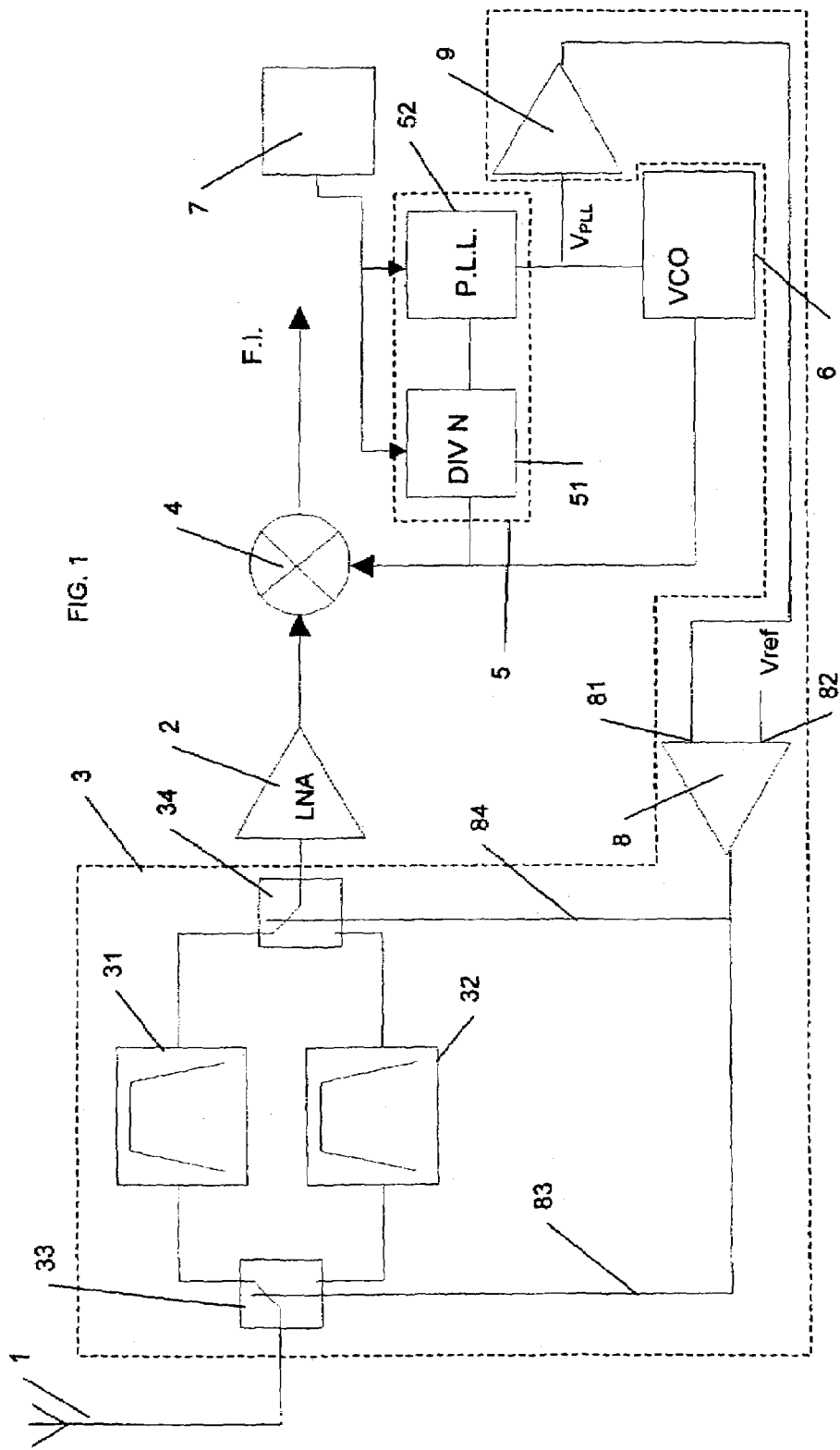
FIG. 1 shows a block diagram of a system for receiving microwave signals, comprising the self-adaptive filtering device according to the invention.

The device according to the invention will now be described with reference to FIG. 1. The device according to the invention is integrated, for example, into a home digital wireless network. More particularly, the device according to the invention may be integrated either into the receiver part or into the transmitter part of a two-way system for deploying a home wireless network, such as a high-performance radio local network developed especially so as to support multimedia applications by a radiocommunication system having a high bit rate (up to 54 Mbit/s in a 5 GHz frequency band). Such a system allows links of the point-to-point or multipoint-to-multipoint type. Specific frequency bands have been allocated in Europe by the CEPT (European Conference on Post Office and Telecommunications Administrations) and in the USA by the FCC (Federal Communication Commission).

In Europe, the frequency bands are 5.15–5.35 GHz, called B1, and 5.47–5.725 GHz, called B2.

In the USA, the frequency bands are 5.15–5.35 GHz and 5.725–5.825 GHz.

The channels are separated by 20 MHz in each of the frequency sub-bands and their central frequencies are as follows:

| $f_c$[MHz]Europe | $f_c$[MHz]USA |
|---|---|
| 5180 | 5180 |
| 5200 | 5200 |
| 5220 | 5220 |
| 5240 | 5240 |
| 5260 | 5260 |
| 5280 | 5280 |
| 5300 | 5300 |
| 5320 | 5320 |
| 5500 | |
| 5520 | |
| 5540 | |
| 5560 | |
| 5580 | |
| 5600 | |
| 5620 | |
| 5640 | 5745 |
| 5660 | 5765 |
| 5680 | 5785 |
| 5700 | 5805 |

It is known that the receiver part of such a system comprises a receiving antenna (1) that transmits the received microwave signal to the input of a low-noise amplifier (2) or LNA. The function of this amplifier (2) is to amplify the signal representative of the transmitted information relative to the noise also picked up by the antenna. Typically, the low-noise amplifier (2) is an amplifier having a narrow frequency band tuned to the frequency band to be received. The amplified microwave signal output by the amplifier (2) is sent to an input of a mixer (4). This mixer (4) receives, on another input, a signal from a voltage-controlled oscillator (6) or VCO, controlled by a frequency synthesizer (5) having a phase-locked loop or PLL (52). The frequency synthesizer (5) also includes a frequency divider (51) controlled by a microprocessor (7). The frequency synthesizer (5) is used to adjust the frequency generated by the oscillator according to the defined frequency of a channel, chosen by the microprocessor (7), allowing information to be received. The mixer (4) then delivers as output a signal at an intermediate frequency, which represents the item(s) of information received. This intermediate-frequency signal is then decoded in order to extract the item(s) of information received.

According to the prior art, and especially according to British Patent Application GB 2 335 100, a band-pass filter is placed between the antenna and the low-noise amplifier in order to limit the frequency spectrum received by the amplifier and thus limit the amount of noise received by the amplifier. Consequently, according to the prior art, the frequency band presented to the amplifier lies at least between the lowest allocated frequency and the highest allocated frequency. In the case of Europe, the frequency band of the band-pass filter applied upstream of the amplifier would be between 5.15 and 5.725 GHz.

According to the invention, the frequency bandwidth presented to the amplifier is, in the example of Europe, either the frequency band B1 or the frequency band B2 depending on the frequency of the signal received on the antenna.

Thus, the self-adaptive filtering device (3) according to the invention for adapting to different frequency bands comprises two filters (31, 32), the pass band of which corresponds to the frequency band B1 and the frequency band B2, respectively. According to the invention, the device (3) also includes selection means (8, 9, 33, 34) making it possible to use either the first filter (31), the pass band of which corresponds to the frequency band B1, if the frequency of the signal to be received lies within the frequency band B1, or the second filter (32), the frequency band of which corresponds to the frequency band B2, if the frequency of the signal to be received lies within the frequency band B2. The selection means comprise two switches (33, 34) making it possible to connect, between the antenna (1) and the low-noise amplifier (2), either the first filter (31) or the second filter (32). These two switches (33, 34) are controlled by control means (8, 9) associated with the frequency synthesizer (5). These control means comprise a comparator (8) receiving, on a first input (81), a voltage ($V_{PLL}$) generated by the phase-lock loop (52). This voltage ($V_{PLL}$) corresponds in fact to the voltage-converted image of the frequency imposed by the frequency synthesizer (5) on the voltage-controlled oscillator (6). Thus, the information relating to the frequency of the signal to be received consists of this voltage ($V_{PLL}$). The comparator (8) receives a reference voltage ($V_{ref}$) on a second input (82). The result of the comparison between the reference voltage ($V_{ref}$) and the voltage corresponding to the image of the frequency imposed on the oscillator (6) generates a control signal on the output of the comparator (8). The output of the comparator (8) is connected via two links (83, 84) to the respective control inputs of each of the two switches (33, 34). The control signal is such that when the voltage ($V_{PLL}$) representative of the image of the frequency imposed on the oscillator (6) corresponds to a frequency contained within the frequency band B1, the control signal causes the switches (33, 34) to switch to the first filter (31). If, on the contrary, the control signal is such that the voltage representative of the image of the frequency imposed on the oscillator (6) corresponds to a frequency contained within the frequency band B2, the control signal causes them to switch to the second filter (32).

According to the invention, the device (3) includes a buffer (9) connected to the first input (81) of the comparator (8). The buffer (9), for example consisting of an amplifier, has the function of buffering the voltage ($V_{PLL}$) generated by the phase-locked loop (52) before it is applied to the comparator.

The device according to the invention operates in the following manner. Two situations may arise.

In the first situation, a link has already been established on a channel whose frequency lies within one of the allocated frequency bands, B1 or B2. For some reason, for example because of excessive interference on the channel or in order to establish a link with another transmitter, the microwave signal received on the antenna will contain a signal that generates a change-of-channel control signal. Extraction of this information from the received signal will cause a control signal to be sent by the microprocessor (7) to the frequency synthesizer (5) in order to change the frequency generated by the oscillator (6) so that it is locked onto the frequency of the requested channel. If the frequency of the new channel lies within the same frequency band as the frequency of the previous channel, the voltage ($V_{PLL}$) generated by the phase-locked loop (52) will not result in a change in the control signal generated on the output of the comparator (8). Consequently, the switches (33, 34) do not change state and the same filter remains connected. If, on the contrary, the frequency of the new channel lies within a frequency band different from the previous channel, the voltage ($V_{PLL}$) generated by the phase-locked loop (52) results in a change in the control signal generated on the output of the comparator (8). Consequently, the switches (33, 34) change state in order to connect the LNA (2) to the filter corresponding to the frequency band within which the frequency of the new channel lies.

In the second situation, the digital wireless system comprising the device according to the invention is powered, but a link has not yet been established. In this case, an initialization procedure is triggered by the microprocessor (7) so that the latter systematically checks all the channels of the allocated frequency bands in order to decode a carrier wave indicating that an item of information has been transmitted. To do this, the microprocessor (7) will cause the frequency synthesizer (5) to scan through all the available channels, starting with a predetermined channel, for example starting with the lowest frequency channel. Each channel is selected for a defined period, in order to check if a carrier has been received on the channel. Thus, during this procedure of scanning the channel frequencies, as long as the frequency of the new channel selected lies within the same frequency band as the frequency of the channel previously tested, the comparator (8) will not cause the switches (33, 34) to change state. Otherwise, as described in the previous situation, the comparator causes a connection to be made to the appropriate filter. The scanning procedure stops as soon as a carrier has been decoded on one of the successively selected channels.

Figure 2:
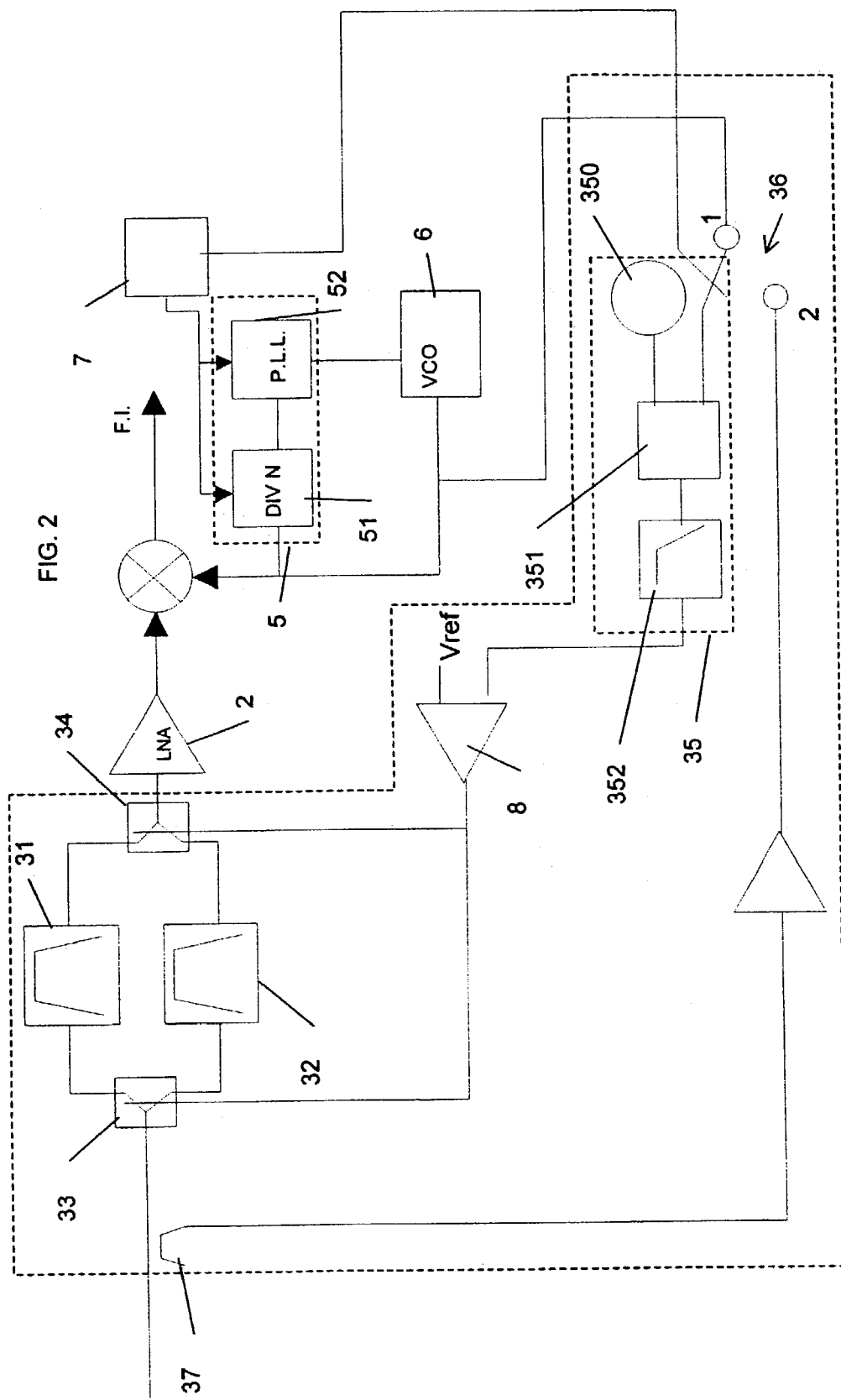
FIG. 2 shows one embodiment of the selection means for the filters of the self-adaptive device according to the invention.

FIG. 2 shows one embodiment of the selection means for the filters of the device according to the invention. The main difference between the embodiment shown in FIG. 1 and the embodiment shown in FIG. 2 lies in the item of information used to change the state of the switches. Thus, in FIG. 1 the item of information used, directly, is the control voltage generated by the synthesizer in order to control the oscillator. According to the embodiment shown in FIG. 2, the item of information used is either the frequency of the oscillator (6) or the frequency of the microwave signal picked up by the antenna. The use of one or other item of information is determined by a control signal generated by the microprocessor (7).

Thus, the device according to the embodiment shown in FIG. 2 comprises a processing circuit (35) whose function is to convert the frequency used as control information into a voltage applied to the first input (81) of the comparator (8). This first circuit comprises a phase/frequency comparator (351), a first input of which receives a signal generated by a fixed-frequency oscillator (350). The second input of the phase/frequency comparator (351) is connected to a switch (36) controlled by the microprocessor (7), making it possible to connect the second input either, in a first position (P1), to the output of the voltage-controlled oscillator (6) or, in a second position (P2), to a coupler (37) delivering an image of the frequency of the signals received on the antenna (1). The phase/frequency comparator (351) generates on its output a control voltage on the first input (81) of the comparator (8) via a low-pass filter (352). Thus, when the switch (36) controlled by the microprocessor (7) is in the first position (P1), the processing circuit (35) delivers, on the first input (81) of the comparator (8), the image of the voltage-converted frequency of the microwave signal generated by the voltage-controlled oscillator (6) in order to cause, when a selection has been made, the self-adaptive filter (31 to 34) to be locked onto a frequency band that includes the channel selected by the microprocessor (7). When the switch (36) controlled by the microprocessor (7) is in the second position (P2, the processing circuit (35) delivers, on the first input (81) of the comparator (8), the image of the voltage-converted frequency of the microwave signal received by the antenna, in order to cause, when a change of channel is made, the self-adaptive filter (31 to 34) to be locked onto the frequency band that includes this channel.

The operation of the device according to the embodiment shown in FIG. 2 is slightly different from that of the device according to the embodiment shown in FIG. 1. Both the abovedefined situations are encountered in the embodiment shown in FIG. 2, but they are handled differently. In the first situation, in which a link has already been established, the microprocessor (7) causes the switch (36) to switch to the second position (P2). In this position, the comparator (8) receives on its first input a voltage corresponding to the image of the frequency of the signals received on the antenna. If, in the situation explained above, a different frequency channel is selected, the coupler (37) will follow the change in frequency of the signal corresponding to the change in channel. Thus, if the frequency of the new channel is not within the same frequency band as the previous channel, the comparator will generate a control signal for switching from one filter to the other.

In the second situation in which the system is powered, the phase of initializing the microprocessor (7) will start with the sending of a control signal to the switch (36) in order to make it switch into the first position P1. In this position, the operation of the device according to the embodiment in FIG. 2 is substantially the same as the device in FIG. 1, except that the comparator (8) does not receive, directly, the control voltage sent by the frequency synthesizer (5) to the oscillator (6), but receives the voltage-converted image of the successive frequencies generated by the voltage-control oscillator (6).

Figure 3:
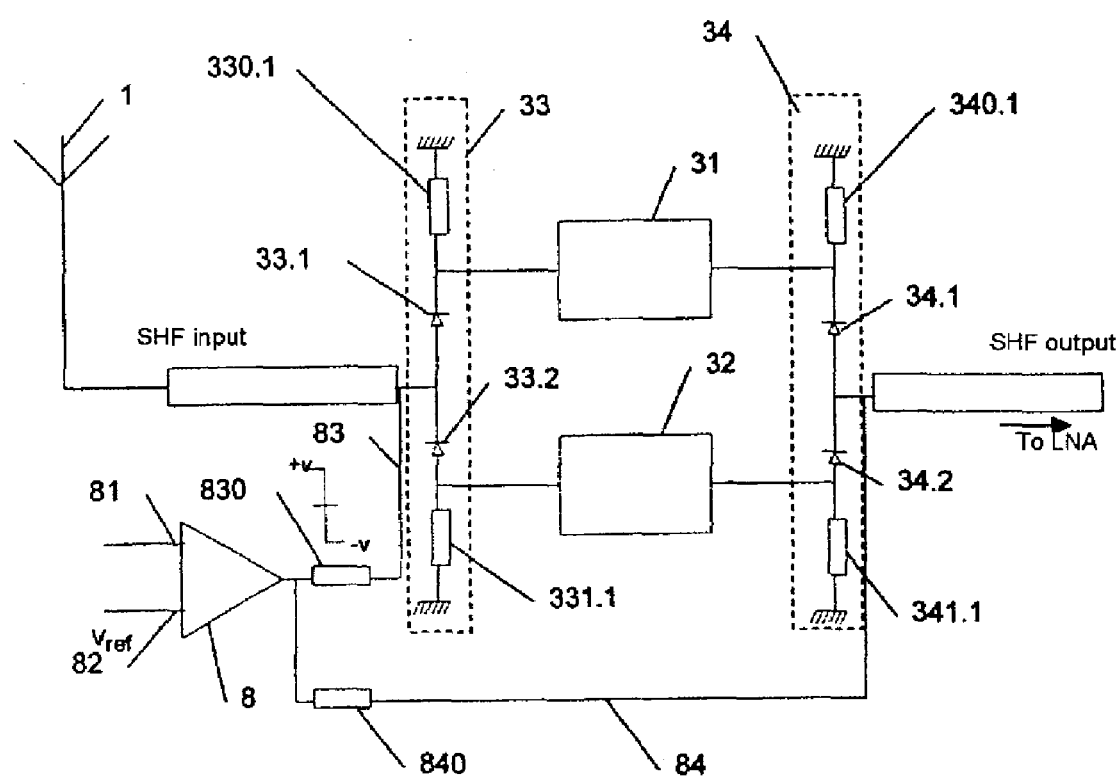
FIG. 3 shows one embodiment of the switching means for the filters of the self-adaptive device according to the invention.

FIG. 3 shows one embodiment of the switches. In this embodiment, each switch (33, 34) comprises a pair of diodes (33.1, 33.2, 34.1, 34.2) in series, for example PIN (P Intrinsic N) diodes. The first pair of diodes (33.1, 33.2) corresponds to the switch mounted between the antenna (1) and the two filters (31, 32), and the second pair of diodes (34.1, 34.2) corresponds to the switch mounted between the low-noise amplifier (LNA) (1) and the two filters (31, 32). The anode of the first diode (33.1, respectively 34.1) and the cathode of the second diode (33.2, respectively 34.2) of the first and second pair of diodes respectively are connected, on the one hand, to the antenna (1) and to the input of the low-noise amplifier (LNA) respectively and, on the other hand, to the output of the comparator (8) via the two links (83, 84) that then each include a shock inductor (830, 840). The cathode of the first diode (33.1, respectively 34.1), on the one hand, is connected to the first filter (31), the anode of the second diode (33.2, respectively 34.2) of each pair of diodes, on the other hand, is connected to the second filter (32), and finally each diode is also connected to earth via the shock inductor. Thus, when the comparator (8) delivers a positive voltage (+V) on the output, the first diodes (33.1, 34.1) of each pair of diodes are forward-biased (in the "on" state), whereas the second diodes (33.2, 34.2) of each pair of diodes are reverse-biased (in the "off" state). Consequently, the first filter (31) connected between the first diodes (33.1, 34.1) of each pair of diodes is selected. When the comparator (8) delivers a negative voltage (−V) on the output, the second diodes (33.2, 34.2) of each pair of diodes are forward-biased, whereas the first diodes (33.1, 34.1) of each pair of diodes are reverse-biased. Consequently, the second filter (32) connected between the second diodes (33.2, 34.2) of each pair of diodes is selected.

FIGS. 4A and 4B show an embodiment of filters of the device according to the invention and the appropriate selection means. In this embodiment, the filters (31, 32) are of the interdigitated type and are composed of microstrip lines (301) of defined length, a first end (303) of which microstrip lines has a plated-through hole connected to earth. According to this principle, by increasing the length L of each microstrip line (300) by a defined length $L_1$, the value of the central tuning frequency of the filter is decreased. Thus, the two filters used in the embodiments shown in FIGS. 1 to 3 are replaced with a filter (30) based on microstrip lines (300), each microstrip line of which is divided into two portions (301, 302) separated by selection means (33'). Each first portion (301) of the microstrip lines (300) is of defined length L. Each second portion (302) is of defined length $L_1$. The selection means (33') make it possible to extend or not the length of the first portion (301) by the length $L_1$ of the second portion (302). The lengths of the first and second portions (301, 302) of each microstrip line are defined so that the filter (30) is tuned to the second frequency band B2 defined above when the length L of all the microstrip lines (301) of the filter (30) correspond only to the length L of the first portion (301). When the length of all the microstrip lines (300) of the filter (30) correspond to the length L of the first portion (301) increased by the length $L_1$ of the second portion (302), then the filter (30) is tuned to the first frequency band B1 defined above. Selection of the first portion (301) or of the first and second portions (301, 302) of each microstrip line (300) is performed by a microwave switch (33') controlled by the comparator (8). In the embodiment shown in FIG. 4B, each microwave switch (33') comprises a diode (33') mounted in series between the two portions (301, 302) of microstrip lines. The cathode of each diode (33') is connected to a first end of the first portion (301), the second end of which is connected to earth. The anode of each diode (33') is connected to a first end of the second portion (302) of the microstrip lines, the second end of which is connected to the output of the comparator (8), for example via a shock inductor (830). Thus, when the comparator delivers a positive voltage on its output, each diode (33') is forward-biased (in the "on" state). In this case, the filter (30) uses a microstrip line length which corresponds to the length of the first portion (301) increased by the length of the second portion (302). Consequently, the filter (30) is tuned to the first frequency band B1. In contrast, when the comparator (8) delivers a negative voltage on its output, each diode (33') is reverse-biased (in the "off" state). In this case, only the microstrip line length which corresponds just to the length of the first portion (301) is used. Consequently, the filter (30) is tuned to the second frequency band B2. Self-adaptive filters tuned to various frequency bands may thus be easily produced.

The description has been given for the purpose of its application to the receiver part, but it is important to point out that the device of the invention may also be used for the transmitter part, in which it may be necessary to switch between two filters having different frequency bands in order to improve the rejection of the local oscillator and the improvement of the image spectrum. Likewise, the invention may be applied to any other frequency band, including those for systems using more than two discrete frequency bands.

It must be obvious to those persons skilled in the art that the present invention allows embodiments in many other specific forms without departing from the field of application of the invention as claimed. Consequently, the present embodiments should be considered as an illustration, but may be modified within the field defined by the scope of the claims appended hereto.

The invention claimed is:

1. A receiving device in a microwave signal transmitter/receiver or receiver, the receiving device including a microwave signal receiving antenna connected to the input of a low-noise amplifier through a self adaptive band pass filtering device comprises, at least one filtering means having at least two different frequency bands and, means for selecting one of the frequency bands depending on the frequency of the signal to be received, a mixer that receives the output signal of the low-noise amplifier and the signal from a frequency synthesizer, wherein said means for selecting comprise switches which are triggered by a control means associated with the frequency synthesizer.

2. The receiving device according to claim 1, wherein the filtering means comprise two band-pass filters and the selection means comprise a pair of microwave switches switching between two states, the said pair of switches being placed on each side of each band-pass filter, so that, in a first state of the pair of switches the signal received by the antenna is filtered by a first of the two filters and in a second state of the pair of switches the signal received by the antenna is filtered by the second of the two filters.

3. The receiving device according to claim 2, wherein the two filters are intended for filtering a first frequency band and a second frequency band, respectively.

4. The receiving device according to claim 2, wherein the frequency bands of the filtering means are separated.

5. The receiving device according to claim 1, wherein the filtering means comprise a filter based on microstrip lines, each microstrip line of which is divided into two separate portions by the switching means, each of the first and second portions of the microstrip lines being of a length defined so that when the switching means allow the received signal to pass, by coupling between microstrip lines, only into the first portion the filter is tuned to a first frequency band, and when the switching means allow the signal to pass, by coupling between microstrip lines, into the first and second portions the filter is tuned to a second frequency band.

6. The receiving device according to claim 3, wherein when the frequency imposed by the frequency synthesizer lies within the first frequency band of the filtering means the control means delivers a signal for making the switches pass into the first state, and when the frequency imposed by the frequency synthesizer lies within the second frequency band of the filtering means the control means delivers a signal for making the switches pass to the second state.

7. The receiving device according to claim 6, wherein the control means comprises a comparator, a first input of which is connected via a buffer stage to the frequency synthesizer in order to receive the voltage-converted image of the frequency produced by the frequency synthesizer and a second input of which receives a defined reference voltage.

8. The receiving device according to claim 6, wherein the control means comprises a comparator, a first input of which is connected to a processing circuit intended to deliver a voltage-converted image either of the frequency generated by the voltage-controlled oscillator or of the frequency of the microwave signal received by the antenna.

9. The receiving device according to claim 8, wherein the processing circuit comprises a phase/frequency comparator, a first input of which receives a signal generated by a fixed-frequency oscillator, the second input of the phase/frequency comparator is connected to a switch controlled by the microprocessor, making it possible to connect the second input either, in a first position, to the output of the voltage-controlled oscillator or, in a second position, to a coupler delivering an image of the frequency of the signals received on the antenna, and the second input of the comparator receives a defined reference voltage.

10. The receiving device according to claim 6, wherein each switch comprises a pair of high-speed diodes mounted in series so that a first pair of diodes is mounted between the antenna and the two filters and the second pair of diodes is mounted between the low-noise amplifier and the two filters.

11. The receiving device according to claim 10, wherein the anode of a first diode of the first pair, connected via its cathode to the first filter, and the cathode of a second diode of the first pair, connected via its anode to the second filter, are connected, on the one hand, to the antenna and, on the other hand, to the output of the comparator via a first link which includes a shock inductor, and wherein the anode of a first diode of the second pair, connected via its cathode to the first filter, and the cathode of a second diode of the second pair, connected via its anode to the second filter, are connected, on the one hand, to the input of the low-noise amplifier and, on the other hand, to the output of the comparator via a second links which includes a shock inductor, the cathode of the first diode and the anode of the second diode of each pair of diodes being also connected to ground through shock inductors.

12. The receiving device according to claim 10, wherein the microwave switches of each microstrip line of the filter include a diode mounted in series between the two portions of the microstrip lines, the cathode of each diode is connected to a first end of the first portion of the microscrip lines, the second end of which is connected to ground, and the anode of each diode is connected to a first end of the second portion of the microstrip lines, the second end of which is connected to the output of the control means.

13. The receiving device according to claim 12, wherein the change of state of the switches of the selection means is triggered by a control means associated with the frequency synthesizer so that when the frequency imposed by the frequency synthesizer lies within the first frequency band of the filtering means the control means delivers a signal for making the switches pass into the first state, and when the frequency imposed by the frequency synthesizer lies within the second frequency band of the filtering means the control means delivers a signal for making the switches pass to the second state.

14. The receiving device according to claim 13, wherein the control means comprises a comparator, a first input of which is connected via a buffer stage to the frequency synthesizer in order to receive the voltage-converted image of the frequency produced by the frequency synthesizer and a second input of which receives a defined reference voltage.

15. The receiving device according to claim 13, wherein the control means comprises a comparator, a first input of which is connected to a processing circuit intended to deliver a voltage-converted image either of the frequency generated by the voltage-controlled oscillator or of the frequency of the microwave signal received by the antenna.

16. The receiving device according to claim 15, wherein the processing circuit comprises a phase/frequency comparator, a first input of which receives a signal generated by a fixed-frequency oscillator, the second input of the phase/frequency comparator is connected to a switch controlled by the microprocessor, making it possible to connect the second input either, in a first position, to the output of the voltage-controlled oscillator or, in a second position, to a coupler delivering an image of the frequency of the signals received on the antenna, and the second input of the comparator receives a defined reference voltage.

* * * * *